US009917559B2

(12) United States Patent
Nonomura et al.

(10) Patent No.: US 9,917,559 B2
(45) Date of Patent: Mar. 13, 2018

(54) HIGH-FREQUENCY POWER AMPLIFIER (71) Applicant: Mitsubishi Electric Corporation, Chiyoda-ku (JP)

(72) Inventors: Hiroyuki Nonomura, Chiyoda-ku (JP); Jun Nishihara, Chiyoda-ku (JP); Toshihiro Fujii, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/503,590

(22) PCT Filed: Jan. 28, 2016

(86) PCT No.: PCT/JP2016/052464
§ 371 (c)(1),
(2) Date: Feb. 13, 2017

(87) PCT Pub. No.: WO2016/163136
PCT Pub. Date: Oct. 13, 2016

(65) Prior Publication Data
US 2017/0244370 A1    Aug. 24, 2017

(30) Foreign Application Priority Data

Apr. 7, 2015    (JP) .................................. 2015-078390

(51) Int. Cl.
*H03F 3/68*    (2006.01)
*H03F 3/60*    (2006.01)
(Continued)

(52) U.S. Cl.
CPC ............ *H03F 3/602* (2013.01); *H03F 3/195* (2013.01); *H03F 1/0288* (2013.01); *H03F 3/211* (2013.01);
(Continued)

(58) Field of Classification Search
CPC .................................. H03F 3/602; H01P 5/12
(Continued)

(56) References Cited

U.S. PATENT DOCUMENTS 5,663,683 A    9/1997   McCandless
2004/0239437 A1   12/2004   Hosoya

FOREIGN PATENT DOCUMENTS

JP    5-191173 A    7/1993
JP    6-152278 A    5/1994
(Continued)

OTHER PUBLICATIONS

International Search Report dated Apr. 12, 2016 in PCT/JP2016/052464 filed Jan. 28, 2016.
(Continued)

*Primary Examiner* — Khanh V Nguyen
*Assistant Examiner* — Khiem Nguyen
(74) *Attorney, Agent, or Firm* — Oblon, McClelland, Maier & Neustadt, L.L.P.

(57) ABSTRACT

An in-line waveguide divider divides power of an incoming high-frequency signal among openings. Amplification boards disposed on a base are provided for respective openings and are each connected in parallel with one another to the in-line waveguide divider. An in-line waveguide combiner includes openings formed correspondingly to the amplification boards, and is connected to the amplification boards. An electrically conductive amplifier cover includes walls formed to provide isolation between circuits of the amplification boards continuously from the in-line waveguide divider to the in-line waveguide combiner, and the entire surface of the amplification boards at the in-line waveguide combiner side is covered with the electrically conductive amplifier cover except openings and openings. Each of the amplification boards includes a waveguide-to-
(Continued)

microstrip transition corresponding to the opening, an amplifier element, and a microstrip-to-waveguide transition corresponding to the opening.

10 Claims, 4 Drawing Sheets

(51) Int. Cl.
    *H03F 3/195*     (2006.01)
    *H03F 1/02*     (2006.01)
    *H03F 3/21*     (2006.01)

(52) U.S. Cl.
    CPC ...... *H03F 3/68* (2013.01); *H03F 2203/21106* (2013.01); *H03F 2203/21142* (2013.01)

(58) Field of Classification Search
    USPC .............................. 330/66, 286, 124 R, 295
    See application file for complete search history.

(56) References Cited

FOREIGN PATENT DOCUMENTS

| | | |
|---|---|---|
| JP | 2012-191122 A | 10/2012 |
| WO | 02/082640 A1 | 10/2002 |

OTHER PUBLICATIONS

Office Action dated Oct. 9, 2017 in United Kingdom Patent Application No. GB1712646.7.

HIGH-FREQUENCY POWER AMPLIFIER

TECHNICAL FIELD

The present disclosure relates to a high-frequency power amplifier for amplifying power of high-frequency signals that can be transmitted through a waveguide.

BACKGROUND ART

Semiconductor high-power elements, including gallium nitride field-effect transistors (GaN FETs), have been increasingly used as power amplifying elements. Advantageous characteristics of the elements, such as long life, help promote the adoption of semiconductor amplifier elements also in amplifiers that used to be configured with vacuum-tube devices. However, the semiconductor amplifier elements alone produce smaller output power than the vacuum-tube devices, and thus the power amplifiers with the semiconductor amplifier elements may divide power of input signals among amplifier elements for amplifying the divided power and then combine the amplified power.

For example, Patent Literature 1 presents a power amplifying device having amplifiers connected in parallel. In the power amplifying device of Patent Literature 1, radial waveguides, which are a power divider and a power combiner, each have a height that is sufficiently smaller than a wavelength of a transverse electromagnetic (TEM) wave propagating through the waveguide. The power divider and the power combiner oppose each other with a slot planar antenna provided with slots on one side of each of the power divider and the power combiner. Amplifiers are inserted between the mutually opposing power divider and power combiner.

Patent Literature 2 discloses a high-frequency module designed to provide shielding performance for each element. The high-frequency module of Patent Literature 2 includes a dielectric substrate and a conductor cover. The dielectric substrate includes on a surface thereof a high-frequency circuit component including elements, a power source for supplying current to the high-frequency circuit component, and a control circuit component for controlling the high-frequency circuit component. The dielectric substrate further includes on both the surfaces thereof printed ground conductors electrically connected via through-holes of the dielectric substrate. The conductor cover includes upstanding walls located between the elements of the high-frequency circuit component and electrically connected to the ground conductors printed on the surfaces of the dielectric substrate. The upstanding walls form a separate enclosed space for each element.

CITATION LIST

Patent Literature

Patent Literature 1: Unexamined Japanese Patent Application Kokai Publication No. 6-152278
Patent Literature 2: Unexamined Japanese Patent Application Kokai Publication No. 2012-191122

SUMMARY OF INVENTION

Technical Problem

In a case in which the power of the input signal is divided among the amplifier elements and is then amplified, the ability to flexibly change the number of signal dividing and the number of signal combining of the amplifier is needed to accommodate a variation of outputs of systems employing the amplifiers.

The power amplifying device as disclosed in Patent Literature 1 is a wideband and low-loss device, but does not provide flexibility that allows an increase in the combined power of the power amplifying device by increasing the number of signal combining by one without changing the configuration of the amplifiers. When the number of amplifiers to be combined is increased, it is necessary to avoid the occurrence of a mutual interference between the elements so as not to degrade the frequency characteristics. Furthermore, when each of the amplifiers has an amplifier element chain employing a plurality of elements, it is also necessary to prevent signal feedback within the amplifier element chain so as not to degrade the frequency characteristics by suppression of oscillation. Thus high-frequency isolation for each amplifier element is necessary, and for the amplifier element chain, a cut-off structure of the high-frequency isolation for each amplifier element within the amplifier element chain is also necessary. The amplifier elements for providing high power typically generate a large amount of heat and thus require a heat dissipating structure in order to keep the junction temperature of the semiconductor element below a specific temperature.

Patent Literature 2 discloses a cut-off structure for providing a separate enclosed space for each element of the high-frequency module. However, Patent Literature 2 does not disclose means for dissipating heat of the high-heat-generating amplifier elements for providing high power.

The present disclosure has been made to solve the problems as above, and an objective of the present disclosure is to enable the number of signal combining of the amplifier to be changed flexibly.

Solution to Problem

To achieve the foregoing objective, a high-frequency power amplifier according to the present disclosure includes a base, an in-line waveguide divider to divide power of an incoming high-frequency signal among unit branches, amplification boards disposed on the base and each connected in parallel with one another to the in-line waveguide divider, the amplification boards being provided for the respective unit branches of the in-line waveguide divider, an in-line waveguide combiner connected to the amplification boards, and including unit joins configured to correspond to the amplification boards and combine power of the incoming high-frequency signal, and an electrically conductive amplifier cover including walls configured to provide isolation between circuits of the amplification boards continuously from the in-line waveguide divider to the in-line waveguide combiner, the walls being provided for the respective amplification boards, the electrically conductive amplifier cover except openings of unit branches and openings of the unit joins covering an entire surface of the amplification boards. Each of the amplification boards includes a waveguide-to-microstrip transition corresponding to the opening of the unit branch, an amplification section including an amplifier element for amplifying the incoming high-frequency signal, and a microstrip-to-waveguide transition corresponding to the opening of the unit join.

Advantageous Effects of Invention

The present disclosure enables the number of signal dividing and combining of the amplifier to be set not only to an even number but to an odd number, and enables the number of signal combining of the amplifier to be changed flexibly by an increase or decrease in the number of amplification boards by the same number.

DESCRIPTION OF EMBODIMENTS

Embodiment 1

Figure 1:
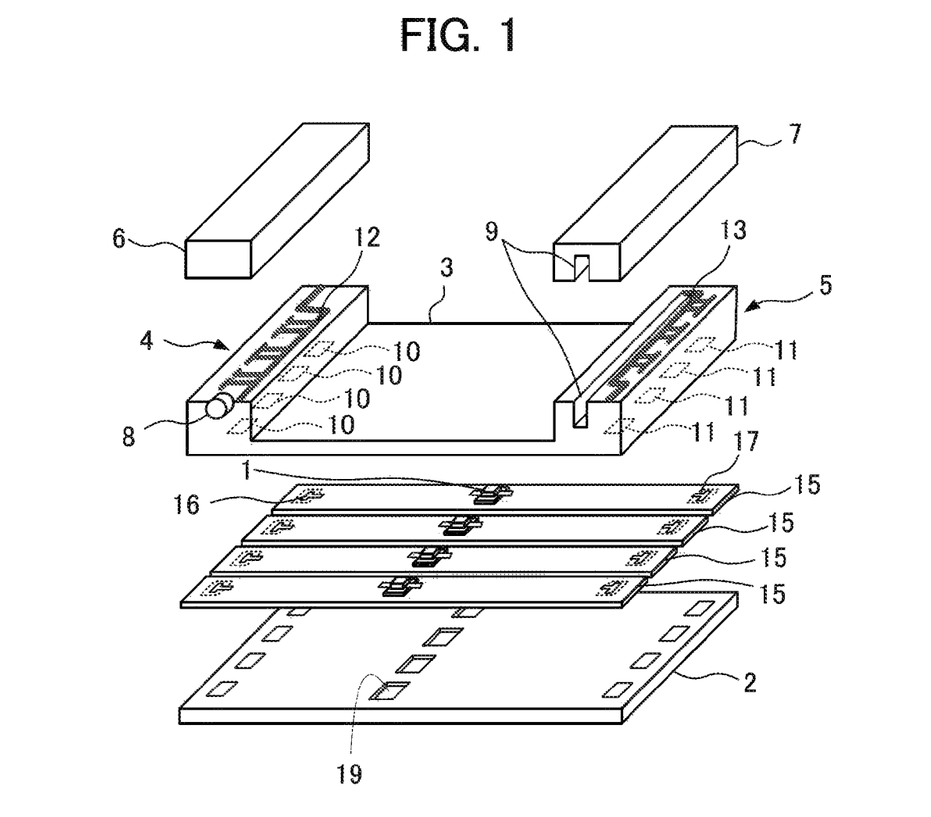
FIG. 1 is an exploded perspective view illustrating an example of a configuration of a high-frequency power amplifier according to Embodiment 1 of the present disclosure.

FIG. 1 is an exploded perspective view illustrating an example of a configuration of a high-frequency power amplifier according to Embodiment 1 of the present disclosure. The high-frequency power amplifier includes a base 2, four amplification boards 15, an electrically conductive cut-off block 3, a divider block 6 that is an upper portion of an in-line waveguide divider 12, and a combiner block 7 that is an upper portion of an in-line waveguide combiner 13. The amplification boards 15 having the same structure each include an amplifier element 1. The base 2 is formed of an electrically conductive material, particularly of metal. The four amplification boards 15 are disposed on the base 2. The base 2 shields the amplification boards 15 on the side opposite to the cut-off block 3 (amplifier cover) side. The cut-off block 3 (amplifier cover) except openings 10 and openings 11 covers entire surfaces of the amplification boards 15. In Embodiment 1, a single amplifier element 1 constitutes an amplification section of the amplification board 15.

The cut-off block 3 (amplifier cover) is formed of an electrically conductive material, particularly of metal, and is integrally formed with a lower portion 4 of the in-line waveguide divider 12 and a lower portion 5 of the in-line waveguide combiner 13. The in-line waveguide divider 12 is hereinafter simply referred to as a divider 12. In addition, the in-line waveguide combiner 13 is hereinafter simply referred to as a combiner 13. The lower portion 4 of the divider 12, which is integrally formed with the cut-off block 3 (amplifier cover), and the divider block 6 are combined one above the other to constitute the divider 12. A plane extending through the waveguide in the travel direction of the high-frequency signal divides the divider 12 into the divider block 6 and the lower portion 4. In addition, the lower portion 5 of the combiner 13, which is integrally formed with the cut-off block 3 (amplifier cover), and the combiner block 7 are combined on above the other to constitute the combiner 13. A plane extending through the waveguide in the travel direction of the high-frequency signal divides the combiner 13 into the combiner block 7 and the lower portion 5.

The divider 12 receives a high-frequency signal from a coaxial connector 8. The divider 12 has four branches, the number of which is the same as that of the amplification boards 15, and the branches are formed in series along the travel direction of the high-frequency signal in the waveguide. Each of the branches is referred to as a unit branch. The branches of the divider 12 are, for example, of a Π-junction type or a T-junction type. The unit branches of the divider 12 are evenly spaced apart by a distance tuned to a guide wavelength. The openings 10 are formed in the lower portion 4 of the divider 12 to align with the unit branches. The high-frequency signals divided at the unit branches are output through the openings 10 to the amplification boards 15. The divider 12 is terminated by a non-reflective terminator. The divider 12 divides power of the high-frequency signal received from the coaxial connector 8 into fourths among the four unit branches sequentially from the coaxial connector 8 of FIG. 1 toward the non-reflective terminator on the farther side. The one-fourth of power is then output from each of the unit branches to the corresponding opening 10. The terminal for the high-frequency signal input is not limited to the coaxial connector, but may be a waveguide.

The amplification boards 15 are provided for the respective unit branches of the divider 12, and are each connected in parallel to one another to the divider 12. The amplification boards 15 are each provided with a waveguide-to-microstrip transition 16 in alignment with the opening 10. The high-frequency signal having transitioned through the waveguide-to-microstrip transition 16 is amplified by the amplifier element 1, and is output to a microstrip-to-waveguide transition 17. A microstrip line connects the waveguide-to-microstrip transition 16 to the amplifier element 1 and another microstrip line connects the amplifier element 1 to the microstrip-to-waveguide transition 17, but such microstrip lines are omitted in FIG. 1.

The combiner 13 has four unit joins corresponding to the amplification boards 15. As in the divider 12, the branches of the combiner 13 have a structure, for example, of a Π-junction type or a T-junction type. The branches of the combiner 13 are for combining signals. The branches of the combiner 13 has an orientation of signal power opposite to that of the branches of the divider 12, and are each thus referred to as a unit join. The unit joins (branches) of the combiner 13 are provided at the same spacing as in the unit branches of the divider 12 spaced apart to be tuned to the guide wavelength. The openings 11 are formed in the lower portion 5 of the combiner 13 to align with the unit joins. The microstrip-to-waveguide transitions 17 are provided in alignment with the respective openings 11 of the combiner 13. The high-frequency signals having transitioned through the microstrip-to-waveguide transitions 17 are input from the openings 11 to the combiner 13.

The branches of the combiner 13 have the same structure as the branches of the divider 12. In other words, for the divider 1 having Π-junctions, the combiner 13 also has Π-junctions, and likewise for the divider 12 having T-junctions, the combiner 13 also has T-junctions. The divider 12 divides the high-frequency signals to be split as the high-frequency signals travels from the coaxial connector 8, which is on the near side as viewed in FIG. 1, to the farther side of the coaxial connector 8. The combiner 13 also includes a terminator at the near side as viewed in FIG. 1, and sequentially combines the high-frequency signals in phase in the reverse order of the dividing order as the high-frequency signals travel from the near to farther side. The high-frequency signals received from the coaxial connector 8 are thus divided into four portions by the divider 12, amplified at the respective amplification boards 15, and then combined in phase by the combiner 13, which results in output signals similar to, the original signals but having power that is the amplified power of the original signals.

Figure 2:
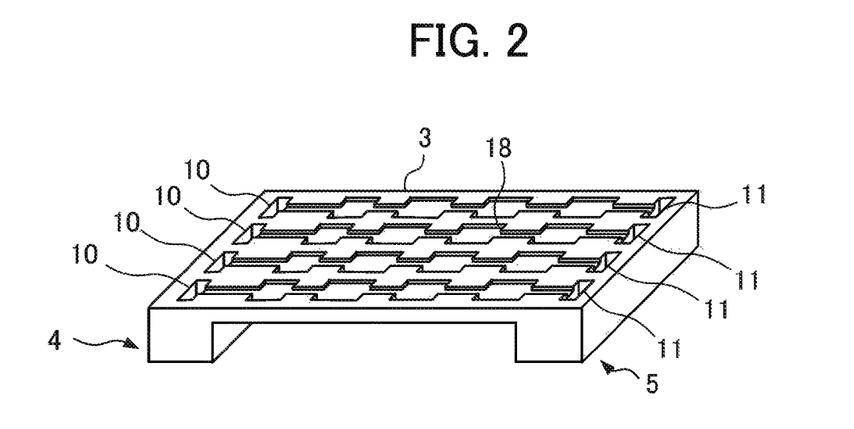
FIG. 2 is a perspective of a cut-off block according to Embodiment 1 as viewed from an amplification board side.

The amplification boards 15 are isolated by walls to be cut off from one another, desirably at the frequency of the high-frequency signal. FIG. 2 is a perspective view of the cut-off block according to Embodiment 1 as viewed from the amplification board side. The cut-off block 3 (amplifier cover) is provided with walls 18 to form a cut-off space for each amplification board 15 at the frequency of the high-frequency signal. The walls 18 are provided such that each amplification board 15 is positioned to be surrounded by the walls 18 in a direction parallel to a line connecting the in-line waveguide divider 12 to the in-line waveguide combiner 13. The walls 18 of the cut-off block 3 (amplifier cover) form an enclosed space on a per amplification board 15 basis. The spacing of the walls 18 is wide at four locations. The single amplifier element 1 included on the amplification board 15 of Embodiment 1 is located in a second wide-spacing area of the walls 18 as counted from the divider 12 side. The cut-off block 3 (amplifier cover) as illustrated in FIG. 2 can apply to the types of amplification boards 15 having up to four amplifier elements 1. Alternatively, a cut-off block (amplifier cover) for use of the amplification board 15 having a single amplifier element 1 may be employed.

Recessed portions 19 for receiving the amplifier elements 1 are formed in the base 2, and isolate an amplifier element 1 from another amplifier element 1 of the adjacent amplification board 15. The opening 10 and the opening 11 are provided for each enclosed space on a per amplification board 15 basis, and thus the cut-off characteristics are kept between the divider 12 and the combiner 13. Accordingly, a stable power dividing and combining type of high-frequency power amplifier can be obtained without characteristic degradation otherwise caused by oscillation or the like in the amplifier circuit.

The cut-off structure satisfies the following conditions:

$$\alpha = \frac{54.6}{\lambda C} \sqrt{1 - \left(\frac{\lambda c}{\lambda}\right)^2} \quad \text{[Equation 1]}$$

where α is a spatial isolation per unit length [dB/mm], λc is a wavelength of a cut-off frequency [mm], and λ is a wavelength of a passing (operating) frequency [mm].

The wavelength λc of the intracavity cut-off frequency in the above simplified equation is defined by the width (for example, given as a [mm]) in a direction perpendicular to the travel (propagation) direction of the high-frequency signal, and can thus be expressed as λc=2a where the cut-off frequency fc=c/λc and c is the speed of light.

This means that when the spacing between the walls 18 of the cut-off block 3 (amplifier cover) is equal to or less than λc, that is, the operating frequency is larger than fc, the walls 18 are determined to have a cut-off structure.

Figure 3:
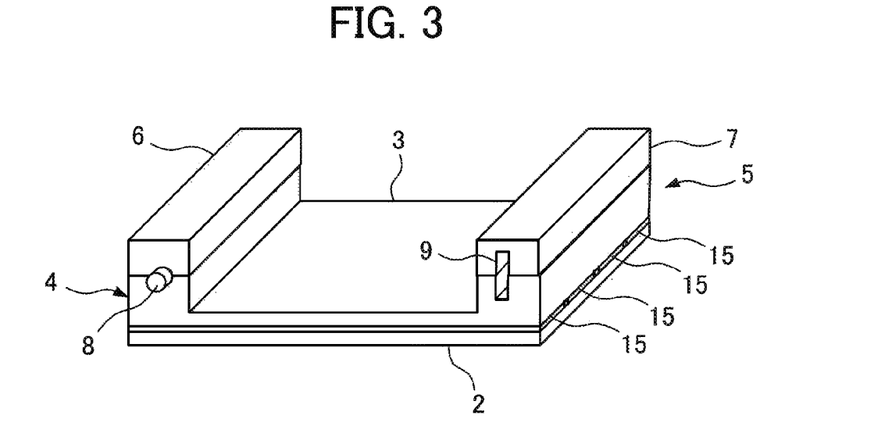
FIG. 3 is a view illustrating the assembled high-frequency power amplifier according to Embodiment 1.

FIG. 3 illustrates the assembled high-frequency power amplifier according to Embodiment 1. The lower portion 4 integral with the cut-off block 3 (amplifier cover) is in tight contact with the divider block 6, which constitutes the divider 12. Similarly, the lower portion 5 integral with the cut-off block 3 (amplifier cover) is in tight contact with the combiner block 7, which constitutes the combiner 13. The amplification boards 15 are held to be sandwiched between the base 2 and the cut-off block 3 (amplifier cover) integrally formed with the lower portion 4 of the divider 12 and the lower portion 5 of the combiner 13. The base 2 and the cut-off block 3 (amplifier cover) are in contact with each other in between the amplification boards 15. The coaxial connector 8 for input of the high-frequency signals and the output terminal of a waveguide 9 for output of the amplified signals are formed on the same side.

Figure 4:
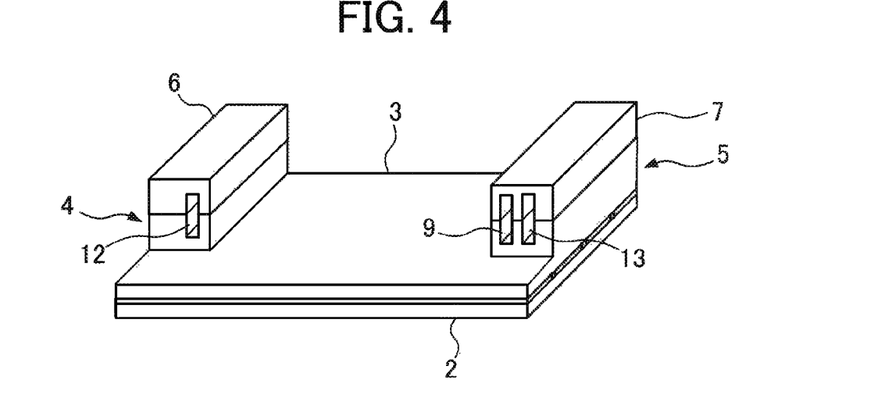
FIG. 4 is a cross-sectional vies of a waveguide of the high-frequency power amplifier according to Embodiment 1.

FIG. 4 is a cross-sectional view of a waveguide of the high-frequency power amplifier according to Embodiment 1. FIG. 4 illustrates, partially in section, the divider 12 and the combiner 13. As illustrated, the waveguide of the divider 12 and the waveguide of the combiner 13 are viewable. The waveguide 9 for return of the output of the combiner 13 is also viewable.

In Embodiment 1, the combined high-frequency signals are folded back at the farther side of the combiner 13 as viewed in the drawing, and are output through the waveguide 9 at the coaxial connector 8 side of the high-frequency power amplifier. The high-frequency signals output from the waveguide 9 are, for example, guided through a waveguide to an antenna and emitted from the antenna toward space.

Figure 5:
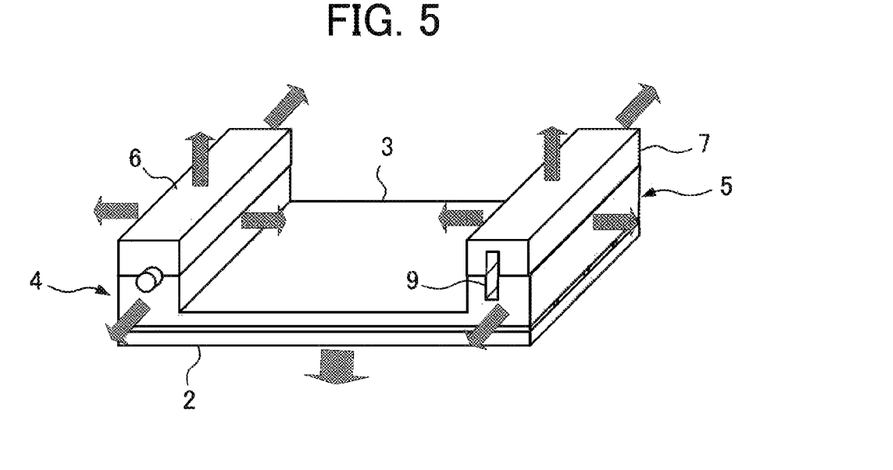
FIG. 5 is a diagram illustrating how the high-frequency power amplifier according to Embodiment 1 dissipates heat.

FIG. 5 illustrates how the high-frequency power amplifier according to Embodiment 1 dissipates heat. Insulators lie between the amplification boards 15 and each of the base 2 and the cut-off block 3 (amplifier cover). The base 2 and the cut-off block 3 (amplifier cover) are in contact with each other in between the amplification boards 15. Thus heat generated in the amplification boards 15 are transmitted from the base 2 and the cut-off block 3 (amplifier cover) to the lower portion 4 and the divider block 6, both of which constitute the divider 12, and the lower portion 5 and the combiner block 7, both of which constitute the combiner 13, and the heat is then released from the surfaces thereof by convection and radiation. Having a metal waveguide structure of the power divider and the power combiner enables heat dissipation from the top and side surfaces of the structure, which thus improves the heat dissipation efficiency because of the increase in the heat dissipation area. The heat generated in the amplification boards 15 is also released from the surface of the base 2 by convection and radiation. Here, mounting a heat sink or a heat pipe on the base 2 and dissipating heat by conduction to the heat sink or the heat pipe improve the heat dissipation efficiency.

The number of amplification boards 15 as in Embodiment 1 is four. However, any number of amplification boards 15, from one upwards, may be included. The divider 12 and the combiner 13 each have the same number of branches as the limber of amplification boards 15. The lower portion 4 and the divider block 6 of the divider 12, and the lower portion 5 and the combiner block 7 of the combiner 13 are formed to have branches having the respective number of branches. The divider 12 divides power of input signal in accordance with the number of branches n and passes one nth of the power to each of the branches sequentially.

Since the high-frequency power amplifier of Embodiment 1 is of a power dividing and combining type employing the waveguide structure, the dividing and combining losses are small. In addition, since an in-line power dividing and combining type is employed, the number of n can be incremented by one, and the output power of the high-frequency power amplifier can be increased and decreased on a per output power basis of the amplifier element without redesign of parts other than the power divider and combiner.

In the high-frequency power amplifier of Embodiment 1, the in-line waveguide divider 12 and the in-line waveguide combiner 13 are provided on the upper portion of the cut-off block 3 (amplifier cover), and the high-frequency signals are passed through the in-line waveguide divider 12 and the in-line waveguide combiner 13 by applying the vertical transformation to the high-frequency signals to be transmitted to the amplification boards 15. Accordingly, a small-sized power dividing and combining type of high-frequency power amplifier can be obtained. In addition, the cut-off structure for the amplifier elements is a structure integral with the divider 12 and the combiner 13, which improves the heat dissipation efficiency because of the increase in the heat dissipation area and results in a reduced number of parts.

Figure 6:
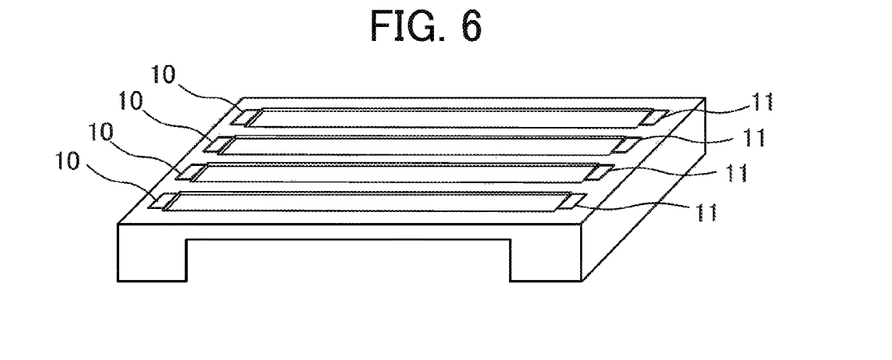
FIG. 6 is a perspective view illustrating another example of a cut-off block according to Embodiment 1 as viewed from the amplification board side.

FIG. 6 is a perspective view illustrating another example of the cut-off block according to Embodiment 1 as viewed from the amplification board side.

The spacing between the walls 18 of the cut-off block 3 (amplifier cover) as illustrated in FIG. 2 has wide portions and narrow portions. Setting the narrow portions of the spacing between the walls 18 to have a length sufficiently shorter than the wavelength of the cut-off frequency improves the cut-off characteristics of the cut-off block 3 (amplifier cover). With the isolation ensured between the in-line waveguide divider 12 and the in-line waveguide combiner 13, providing the narrow portions in the wall 18 spacing is not necessary and the spacing between the walls 18 is uniform as illustrated in FIG. 6.

Figure 7:
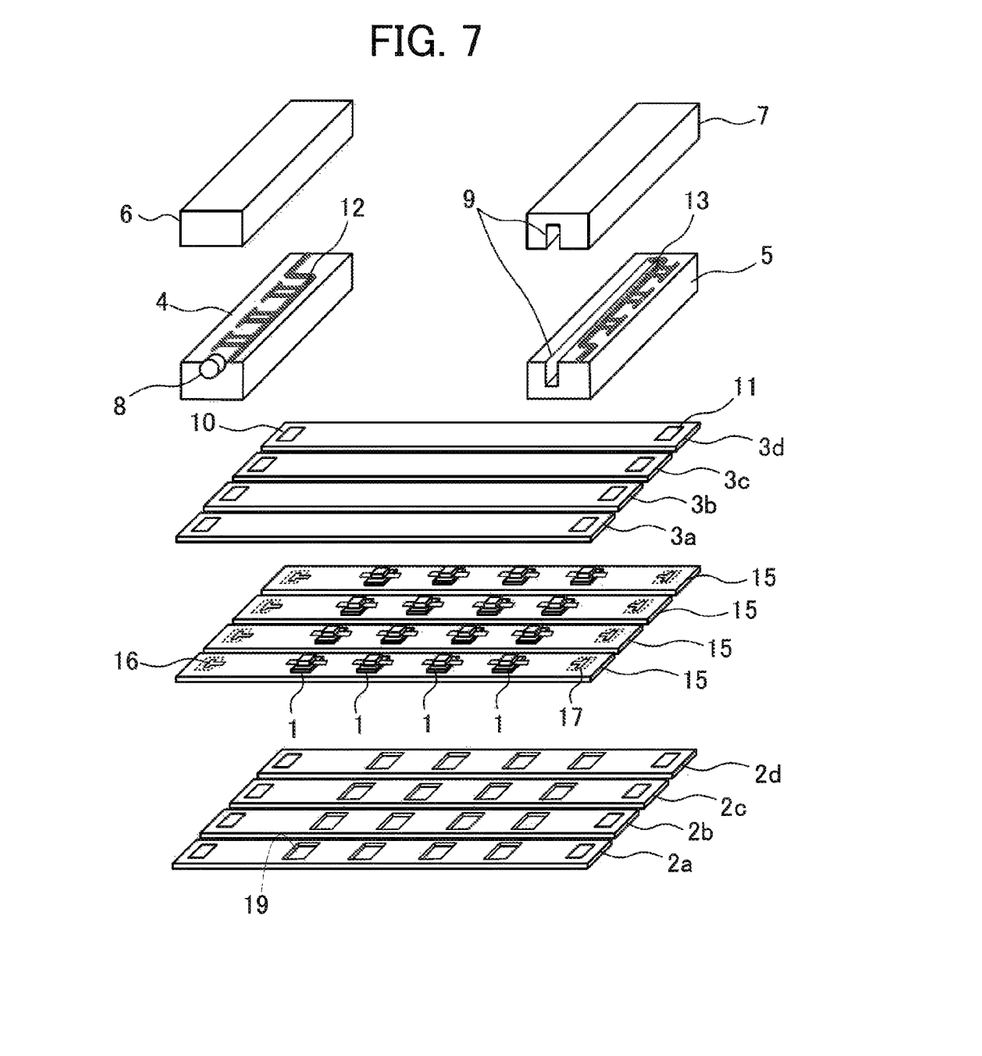
FIG. 7 is an exploded perspective view illustrating another example of a configuration of the high-frequency power amplifier according to Embodiment 1.

FIG. 7 is an exploded perspective view illustrating another example of the configuration of the high-frequency power amplifier according to Embodiment 1.

In FIG. 1, the lower portion 4 of the in-line waveguide divider and the lower portion 5 of the in-line waveguide combiner are integrally formed with the cut-off block 3 (amplifier cover), but as illustrated in FIG. 7, may be separated from the cut-off block 3 (amplifier cover). In this case, the lower portion 4 of the in-line waveguide divider and the lower portion 5 of the in-line waveguide combiner are electrically connected via the waveguides provided on the cut-off blocks 3 (amplifier cover).

In addition, the cut-off block 3 (amplifier cover) in FIG. 1 covers all the four amplification boards 15, but as illustrated in FIG. 7, each of the amplification boards 15 may be configured to be covered with the corresponding one of the cut-off block 3a, 3b, 3c, and 3d (amplifier cover) and the corresponding one of the base 2a, 2b, 2c, and 2d.

Embodiment 2

Figure 8:
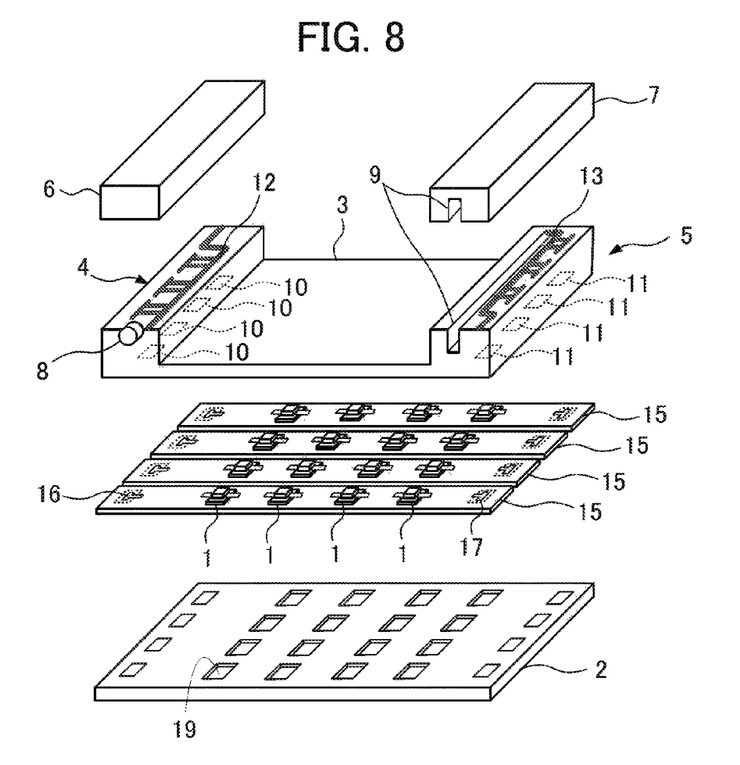
FIG. 8 is an exploded perspective view illustrating an example of a configuration of a high-frequency power amplifier according to Embodiment 2 of the present disclosure.

FIG. 8 is an exploded perspective view illustrating an example of a configuration of a high-frequency power amplifier according the Embodiment 2 of the present disclosure. Embodiment 1 involves the single amplifier element 1 constituting the amplification section of the amplification board 15, while Embodiment 2 involves in amplifier elements 1 constituting the amplification section to form an amplifier element chain. FIG. 8 illustrates an example of a case in which the number n of amplification boards, which is equal to the number of branches, is 4, and the number m of amplifier elements in the amplifier element chain is equal to 4.

The perspective view of the cut-off block 3 (amplifier cover) of Embodiment 2 is the same as that of FIG. 2. The cut-off block 3 (amplifier cover) is formed so that the amplifier elements 1 are received in the wide-spacing area between the walls 18. In Embodiment 2, four recessed portions 19 are formed in a base 2 for each of the amplification boards 15 so as to receive the amplifier elements 1, and serve for cutting off the amplifier elements 1 within the amplifier element chain from one another and also from the amplifier elements 1 in the adjacent amplification boards 15.

The cut-off block 3 (amplifier cover) ensures isolation of the amplifier element chains (circuits) of the amplification boards 15 from one another, and also ensures isolation of the in amplifier elements 1 in each amplifier element chain from one another by cutting off the in amplifier elements 1, which reduces or eliminates the signal return through the space. The cut-off block 3 (amplifier cover) provides stabilization of the frequency characteristics and suppression of oscillation for the high-frequency power amplifier. The other effects are similar to the effects in Embodiment 1.

Embodiment 3

Figure 9:
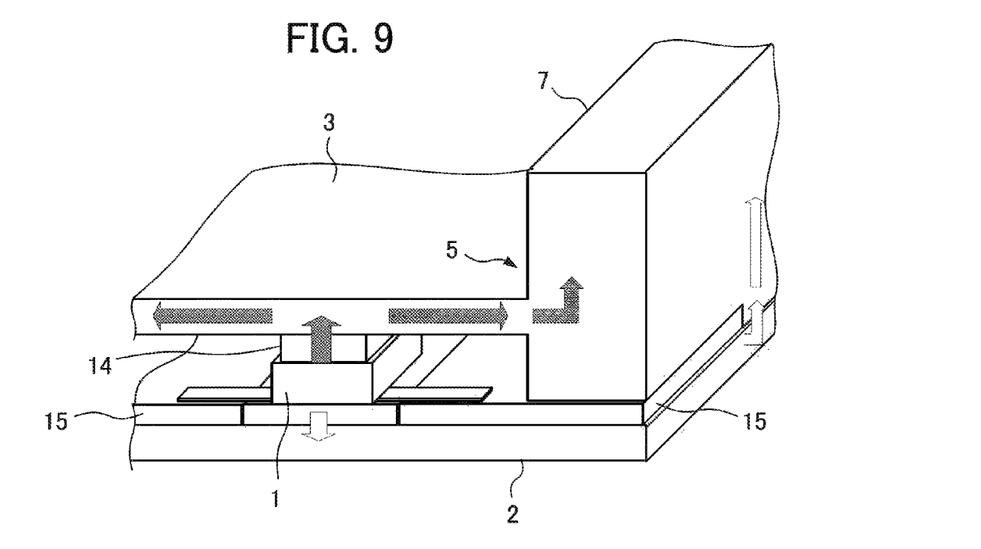
FIG. 9 is a view illustrating heat dissipation paths of a high-frequency power amplifier according to Embodiment 3 of the present disclosure.

FIG. 9 is a view illustrating heat dissipation paths of a high-frequency power amplifier according to Embodiment 3 of the present disclosure. In Embodiment 3, the amplifier elements 1 are in contact with the cut-off block 3 (amplifier cover) via respective thermally conductive members 14. Shaded arrows depicted in FIG. 9 indicate paths of heat transferring via the thermally conductive member 14 through the cut-off block 3 (amplifier cover), the lower portion 5 of the in-line waveguide combiner, and the combiner block 7. In addition, hollow arrows indicate a path of heat transferring via the base 2 through the lower portion 5 of the in-line waveguide combiner and the combiner block 7. The heat generated in the amplifier element 1 is transferred through the thermally conductive member 14 to the cut-off block 3 (amplifier cover). As illustrated in FIG. 5, the heat is then released from the surfaces of the divider 12 and the surfaces of the combiner 13 to be dissipated into the atmosphere. The heat generated in the amplification board 15 is also released from the surfaces of the base 2 by convection and radiation. Here, mounting, a heat sink or a heat pipe on the base 2 and dissipating heat by conduction to the heat sink or the heat pipe improve the heat dissipation efficiency.

The heat dissipation path is configured with in amplifier elements 1 in a single amplifier element chain being in contact with the cut-off block 3 (amplifier cover) via the respective thermally conductive member 14. Thus the heat generated by the amplifier elements 1 is dissipated into the atmosphere not only from the base 2 side, but also through the path leading via the cut-off block 3 (amplifier cover) through the divider block 6 and the combiner block 7. Particularly, the amplifier element 1 located close to the output side of the high-frequency power amplifier has a tendency to generate more heat, and thus arranging that amplifier element 1 to be near the lower portion 5 of the combiner 13 provides for a shorter heat dissipation path, which enables active heat dissipation.

As described in Embodiment 1, even when the thermally conductive member 14 is not implemented on the upper portion of the amplifier element 1, the heat is transferred from the lower surface of the amplifier element 1 via the base 2 and the cut-off block 3 (amplifier cover) to the divider 12 and the combiner 13 because the base 2 and the cut-off block 3 (amplifier cover), which are of metal having a high thermal conductivity, are in contact with each other. In any of the arrangements, heat dissipation from the cut-off block 3 (amplifier cover) through the divider block 6 and the combiner block 7 can be expected. In Embodiment 3, an even higher heat dissipation efficiency is achieved because the amplifier element 1 is in contact with the cut-off block 3 (amplifier cover) via the thermally conductive member 14.

The high-heat-generating amplifier element 1 close to the output side of the high-frequency power amplifier is desirably arranged to be directly below the combiner 13 since the arrangement provides for the high heat dissipation efficiency. Unfortunately, since the cut-off block 3 (amplifier cover) is integrally formed with the lower portion 5 of the combiner 13, the high-heat-generating amplifier element 1 located close to the output side of the high-frequency power amplifier is provided directly below a cover portion that is not the lower portion 5 of the cut-off block 3 (amplifier cover). However, even with this arrangement in which the high-heat-generating amplifier element 1 located close to the output side of the high-frequency power amplifier is provided directly below the cover portion that is not the lower portion 5 of the cut-off block 3 (amplifier cover), the high-frequency power amplifier with a high heat dissipation property can be obtained because the heat resistance between the cut-off block 3 (amplifier cover) and the combiner 13 is low.

The present disclosure can be embodied in various ways and can undergo various modifications without departing from the broad spirit and scope of the disclosure. Moreover, the foregoing describes some example embodiments for explanatory purposes, and do not limit the scope of the present disclosure. In other words, the scope of the present disclosure is as set forth in the claims and not in the embodiments. Various changes and modifications that are made within the scope of the claims, along with the full range of equivalents to which such claims are entitled, are also included within the scope of the present disclosure.

This application claims the benefit of Japanese patent Application No. 2015-078390, filed on Apr. 7, 2015, the entire disclosure of which is incorporated by reference herein.

REFERENCE SIGNS LIST

1 Amplifier element
2, 2a, 2b, 2c, 2d Base
3, 3a, 3b, 3c, 3d Cut-off block (amplifier cover)
4 Lower portion of in-line waveguide divider
5 Lower portion of in-line waveguide combiner
6 Divider block (upper portion of in-line waveguide divider)
7 Combiner block (upper portion of in-line waveguide combiner)
8 Coaxial connector
9 Waveguide
10, 11 Opening
12 waveguide divider
13 in-line waveguide combiner
14 Thermally conductive member
15 Amplification board
16 Waveguide-to-microstrip transition
17 Microstrip-to-waveguide transition
18 Wall
19 Recessed portion

The invention claimed is:

1. A high-frequency power amplifier comprising:
a base;
an in-line waveguide divider to divide power of an incoming high-frequency signal among unit branches;
amplification boards disposed on the base and each connected in parallel with one another to the in-line waveguide divider, the amplification boards being provided for the respective unit branches of the in-line waveguide divider;
an in-line waveguide combiner connected to the amplification boards, and including unit joins configured to correspond to the amplification boards and combine power of the incoming high-frequency signal; and
an electrically conductive amplifier cover including walls configured to provide isolation between circuits of the amplification boards continuously from the in-line waveguide divider to the in-line waveguide combiner, the walls being provided for the respective amplification boards, the electrically conductive amplifier cover except openings of the unit branches and openings of the unit joins covering an entire surface of the amplification boards,
wherein each of the amplification boards includes a waveguide-to-microstrip transition corresponding to the opening of the unit branch, an amplification section including an amplifier element for amplifying the incoming high-frequency signal, and a microstrip-to-waveguide transition corresponding to the opening of the unit join,
wherein the base includes recessed portions formed therein for receiving the amplifier elements mounted on the amplification boards, and
wherein the electrically conductive amplifier cover includes wide-spacing areas between the walls configured to provide isolation between the circuits of the amplification boards and narrow-spacing areas between the walls configured to provide isolation between the circuits of the amplification boards, the narrow-spacing areas being narrower than the wide-spacing areas, and the amplifier elements are disposed in the wide-spacing areas between the walls configured to provide isolation between the circuits of the amplification boards.

2. The high-frequency power amplifier according to claim 1, wherein the base is formed of an electrically conductive material.

3. The high-frequency power amplifier according to claim 1, wherein the electrically conductive amplifier cover is a cut-off block having cut-off characteristics at a frequency of the incoming high-frequency signal.

4. The high-frequency power amplifier according to claim 1, wherein
the amplification section of the amplification board includes a plurality of the amplifier elements connected in series, and
the electrically conductive amplifier cover is configured to cut off the amplifier elements included in the amplification section from one another and reduce signal return through space.

5. The high-frequency power amplifier according to claim 1, wherein each of the amplifier elements is in contact with the electrically conductive amplifier cover via a thermally conductive member.

6. A high-frequency power amplifier comprising:
a base;
an in-line waveguide divider to divide power of an incoming high-frequency signal among unit branches;

amplification boards disposed on the base and each connected in parallel with one another to the in-line waveguide divider, the amplification boards being provided for the respective unit branches of the in-line waveguide divider;

an in-line waveguide combiner connected to the amplification boards, and including unit joins configured to correspond to the amplification boards and combine power of the incoming high-frequency signal; and an electrically conductive amplifier cover including walls configured to provide isolation between circuits of the amplification boards continuously from the in-line waveguide divider to the in-line waveguide combiner, the walls being provided for the respective amplification boards, the electrically conductive amplifier cover except openings of the unit branches and openings of the unit joins covering an entire surface of the amplification boards, wherein each of the amplification boards includes a waveguide-to-microstrip transition corresponding to the opening of the unit branch, an amplification section including an amplifier element for amplifying the incoming high-frequency signal, and a microstrip-to-waveguide transition corresponding to the opening of the unit join;

each of the in-line waveguide divider and the in-line waveguide combiner is formed to be divided, in a plane extending through a waveguide in a travel direction of the incoming high-frequency signal, into a lower portion connected to the amplification boards and an upper portion located opposite to the amplification boards; and the lower portion of the in-line waveguide divider, the lower portion of the in-line waveguide combiner, and the electrically conductive amplifier cover are integrally formed.

7. The high-frequency power amplifier according to claim 6, wherein the base is formed of an electrically conductive material.

8. The high-frequency power amplifier according to claim 6, wherein the electrically conductive amplifier cover is a cut-off block having cut-off characteristics at a frequency of the incoming high-frequency signal.

9. The high-frequency power amplifier according to claim 6, wherein
the amplification section of the amplification board includes a plurality of the amplifier elements connected in series, and
the electrically conductive amplifier cover is configured to cut off the amplifier elements included in the amplification section from one another and reduce signal return through space.

10. The high-frequency power amplifier according to claim 6, wherein each of the amplifier elements is in contact with the electrically conductive amplifier cover via a thermally conductive member.

* * * * *